(12) United States Patent
Jeong et al.

(10) Patent No.: US 7,915,101 B2
(45) Date of Patent: Mar. 29, 2011

(54) THIN FILM TRANSISTOR AND ORGANIC LIGHT EMITTING DISPLAY USING THE SAME

(75) Inventors: Jae-kyeong Jeong, Suwon (KR); Yeon-gon Mo, Suwon (KR); Jin-seong Park, Suwon (KR); Hyun-soo Shin, Suwon (KR); Hun-jung Lee, Suwon (KR); Jong-han Jeong, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 43 days.

(21) Appl. No.: 12/118,345

(22) Filed: May 9, 2008

(65) Prior Publication Data

US 2008/0277657 A1     Nov. 13, 2008

(30) Foreign Application Priority Data

May 10, 2007   (KR) ................. 10-2007-0045553

(51) Int. Cl.
*H01L 21/00* (2006.01)
*H01L 21/84* (2006.01)
*H01L 29/10* (2006.01)
*H01L 29/12* (2006.01)

(52) U.S. Cl. ......... 438/151; 257/E31.041; 257/E29.117; 257/E29.137; 257/43

(58) Field of Classification Search .......... 438/151; 257/43, 359, E31.041, E29.117, E29.137, 257/79–88, 184, 431, 444, E51.018, E51.022, 257/E33.001, E29.094, E29.296, E21.46, 257/E21.466

See application file for complete search history.

(56) References Cited

U.S. PATENT DOCUMENTS

| 3,676,921 | A | * | 7/1972 | Kooi | 438/297 |
| 5,506,186 | A | * | 4/1996 | Van Gurp | 438/45 |
| 2007/0108446 | A1 | * | 5/2007 | Akimoto | 257/61 |

FOREIGN PATENT DOCUMENTS

| JP | 2002-94114 | 3/2002 |
| JP | 2004-273614 | 9/2004 |
| KR | 10-0635514 | 10/2006 |
| KR | 1020070035373 A | 3/2007 |

OTHER PUBLICATIONS

Patent Abstracts of Japan, Publication No. 2002-094114; Date of Publication: Mar. 29, 2002; in the name of Hiroya Iwata, et al.
Patent Abstracts of Japan, Publication No. 2004-273614; Date of Publication: Sep. 30, 2004; in the name of Tatsuya Fujita, et al.
Korean Patent Abstracts, Publication No. 100635514 B1; Date of Publication: Oct. 11, 2006; in the name of Dong Soo Choi, et al.

* cited by examiner

*Primary Examiner* — N Drew Richards
*Assistant Examiner* — Monica D Harrison
(74) *Attorney, Agent, or Firm* — Christie, Parker & Hale, LLP

(57) ABSTRACT

Thin film transistors and organic light emitting displays using the same are provided. The thin film transistor may include a substrate, a semiconductor layer, a gate electrode, and source/drain electrodes on the substrate. The semiconductor layer is composed of a P-type semiconductor layer obtained by diffusing phosphorus into a zinc oxide semiconductor. The phosphorus is doped in the semiconductor layer to a concentration ranging from about $1\times10^{14}$ to about $1\times10^{18}$ cm$^{-3}$.

16 Claims, 7 Drawing Sheets

THIN FILM TRANSISTOR AND ORGANIC LIGHT EMITTING DISPLAY USING THE SAME

CROSS-REFERENCE TO RELATED APPLICATIONS

This application claims priority to and the benefit of Korean Patent Application No. 10-2007-0045553, filed on May 10, 2007 in the Korean Intellectual Property Office, the entire content of which is incorporated herein by reference.

BACKGROUND OF THE INVENTION

1. Field of the Invention

The present invention relates to thin film transistors and organic light emitting displays including the same. More particularly, the invention relates to a thin film transistor including a P-type semiconductor layer and an organic light emitting display including the same.

2. Description of Related Art

In general, semiconductor layers using amorphous silicon or poly silicon have been widely used in thin film transistors for organic light emitting displays. However, since semiconductor layers formed of amorphous silicon have lower mobility, it is difficult to use such a semiconductor layer as a driving circuit of a display panel requiring high operation speed. In contrast, poly silicon has higher mobility. However, the threshold voltage is non-uniform, generally requiring an additional compensating circuit. Furthermore, thin film transistors having semiconductor layers formed of amorphous silicon or poly silicon generate leakage currents from irradiation of light, which leads to a deterioration in the characteristics of the thin film transistors.

Recently, an oxide semiconductor has been proposed. For example, a thin film transistor using ZnO or an oxide semiconductor with the ZnO as a semiconductor layer has been proposed.

FIG. 1 is a cross-sectional view showing a conventional thin film transistor having a semiconductor layer formed of ZnO. With reference to FIG. 1, the thin film transistor 100 includes a source electrode 120a, a drain electrode 120b, a semiconductor layer 130, a gate insulating layer 140, and a gate electrode 150. The source electrode 120a and the drain electrode 120b are formed on an insulation substrate 110. The semiconductor layer 130 contacts the source and drain electrodes 120a and 120b, and is formed of ZnO. The gate insulating layer 140 and the gate electrode 150 are stacked on the semiconductor layer 130.

Since the ZnO semiconductor (or oxide semiconductor having ZnO) has a band gap of 3.4 (greater than that of light energy in a visible ray region), the leakage current of the thin film transistor is not increased due to the absorption of visible rays. However, the ZnO semiconductor (or oxide semiconductor having ZnO) is indicative of an N-type semiconductor layer due to oxygen vacancy, zinc interstitial, and hydrogen incorporation. In contrast, organic light emitting displays generally use P-type semiconductor layers.

When forming an organic light emitting display using a N-type semiconductor layer, a method of preparing the organic light emitting display using an inverted type organic light emitting diode has been proposed to address variations in data voltage due to the degradation of the organic light emitting diode. Here, the inverted type organic light emitting diode is an organic light emitting diode in which a cathode electrode, an emission layer, and an anode electrode are sequentially formed on a thin film transistor on a substrate.

However, in organic light emitting displays using inverted type organic light emitting diodes, the contact characteristics of the cathode electrode and the emission layer may be deteriorated, and defects in the emission layer due to the anode electrode being formed on the emission layer may occur. That is, the contact characteristics of the cathode electrode (formed of a silver (Ag) alloy) and the emission layer (formed of inorganic materials) may be deteriorated. Furthermore, when the anode electrode, such as indium tin oxide (ITO) or indium zinc oxide (IZO), is formed on the emission layer by sputtering, the emission layer can be damaged.

SUMMARY OF THE INVENTION

According to one embodiment of the present invention, a thin film transistor includes a P-type semiconductor layer. In another embodiments, an organic light emitting display includes the thin film transistor.

In one embodiment of the present invention, a thin film transistor comprises a substrate, a semiconductor layer on the substrate, a gate electrode on the substrate, and source/drain electrodes on the substrate, wherein the semiconductor layer includes a P-type semiconductor layer obtained by diffusing phosphorus into a zinc oxide semiconductor, where the phosphorus is doped in the semiconductor layer at a concentration ranging from about $1\times10^{14}$ to about $1\times10^{18}$ cm$^{-3}$.

The semiconductor layer may be formed by diffusing the phosphorus in a material selected from the ZnO, ZnGaO, AnInO, In$_2$O$_3$, ZnInGaO, ZnSnO, and combinations thereof.

According to another embodiment of the present invention, a method of manufacturing a thin film transistor comprises forming and patterning a gate electrode on a substrate, forming a gate insulating layer on the gate electrode, forming a semiconductor layer including a zinc oxide semiconductor on the gate insulating layer, diffusing a phosphorus compound on the semiconductor layer to form a zinc oxide semiconductor layer of a P-type semiconductor layer, and forming source/drain electrodes on the P-type semiconductor layer.

According to another embodiment of the present invention, a method of manufacturing a thin film transistor comprises forming a semiconductor layer composed of a zinc oxide semiconductor including source/drain regions and a channel region on a substrate, diffusing a phosphorus compound on the semiconductor layer to form a zinc oxide semiconductor layer of a P-type semiconductor layer, forming a gate insulating layer on the semiconductor layer, forming a gate electrode corresponding to the channel region of the semiconductor layer on the gate insulating layer, forming an interlayer insulation layer on the gate electrode, and forming source/drain electrodes to be electrically coupled to the semiconductor layer through a contact hole formed in the gate insulating layer and the interlayer insulation layer.

The phosphorus (P) compound may be Zn$_3$P$_2$. The phosphorus (P) compound may be in powder form. The semiconductor layer composed of the zinc oxide semiconductor may be selected from ZnO, ZnGaO, AnInO, In$_2$O$_3$, ZnInGaO, ZnSnO, and combinations thereof. Also, diffusing the phosphorus (P) compound on the semiconductor layer may include arranging a mask above the semiconductor layer, an opening in the mask being formed at a region corresponding to the semiconductor layer.

According to yet another embodiment of the present invention, an organic light emitting display comprises a thin film transistor including a substrate, a semiconductor layer, a gate electrode, and source/drain electrodes on the substrate; and an organic light emitting diode on the thin film transistor and electrically connected to the thin film transistor, wherein the semiconductor layer includes a P-type semiconductor layer obtained by diffusing phosphorus into a zinc oxide semiconductor, and the phosphorus is doped in the semiconductor layer at a concentration ranging from about $1\times10^{14}$ to about $1\times10^{18}$ cm$^{-3}$. The semiconductor layer including the P-type semiconductor may be formed by diffusing the phosphorus (P) in a material selected from ZnO, ZnGaO, AnInO, In$_2$O$_3$, ZnInGaO, ZnSnO, and combinations thereof.

BRIEF DESCRIPTION OF THE DRAWINGS

These and other features and advantages of the present invention will become more apparent by reference to the following detailed description when considered in conjunction with the accompanying drawings in which.

DETAILED DESCRIPTION OF EXEMPLARY EMBODIMENTS

Figure 1:
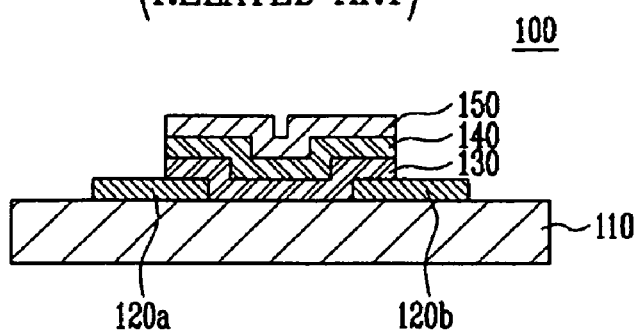
FIG. 1 is a cross-sectional view of a thin film transistor having a semiconductor layer formed of ZnO.

Hereinafter, certain exemplary embodiments of the present invention will be described with reference to the accompanying drawings. As used herein, "coupled" means not only directly coupled, but also indirectly coupled. For example, a first element that is coupled to a second element may be directly coupled to the second element, or may be indirectly coupled to the second element via a third element. Also, like reference numerals refer to like elements throughout this disclosure.

Figure 2:
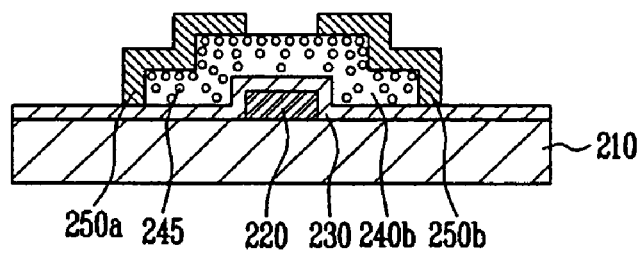
FIG. 2 is a cross-sectional view of a thin film transistor according to one embodiment of the present invention.
Figure 3:
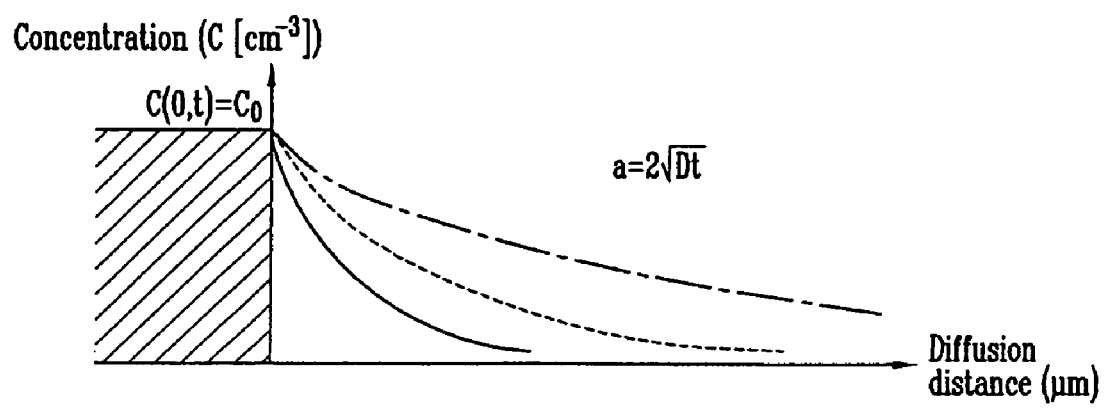
FIG. 3 is a graph of the impurities distributed inside a semiconductor layer according to one embodiment of the present invention.
Figure 4A:
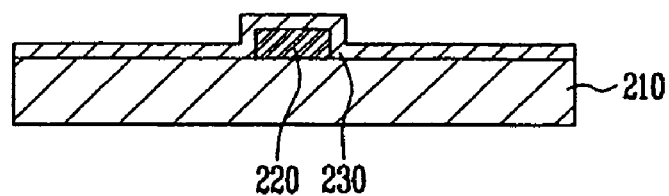
FIGS. 4A to 4E are cross-sectional views of a thin film transistor at various points in a manufacturing method of a thin film transistor according to one embodiment of the present invention.
Figure 4B:
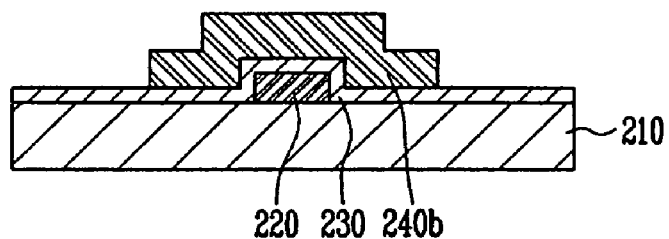
Figure 4C:
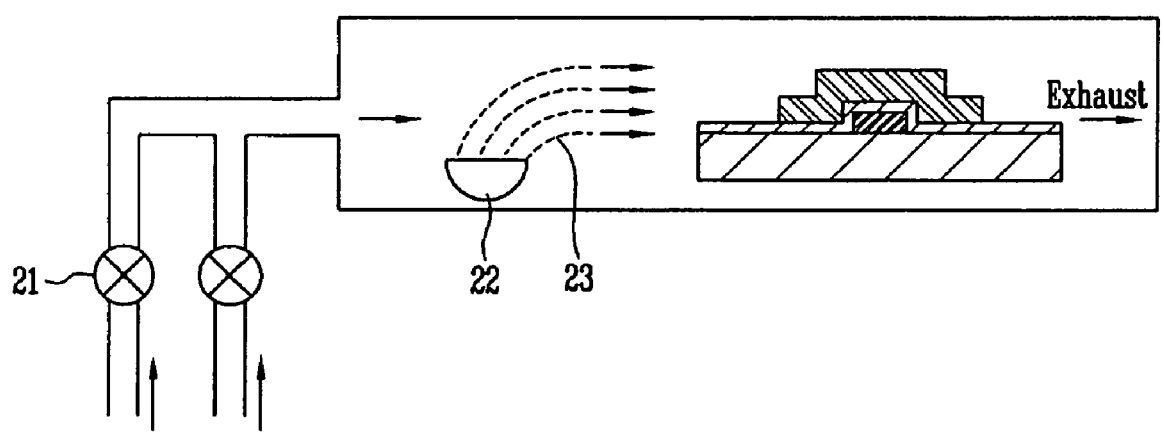
Figure 4D:
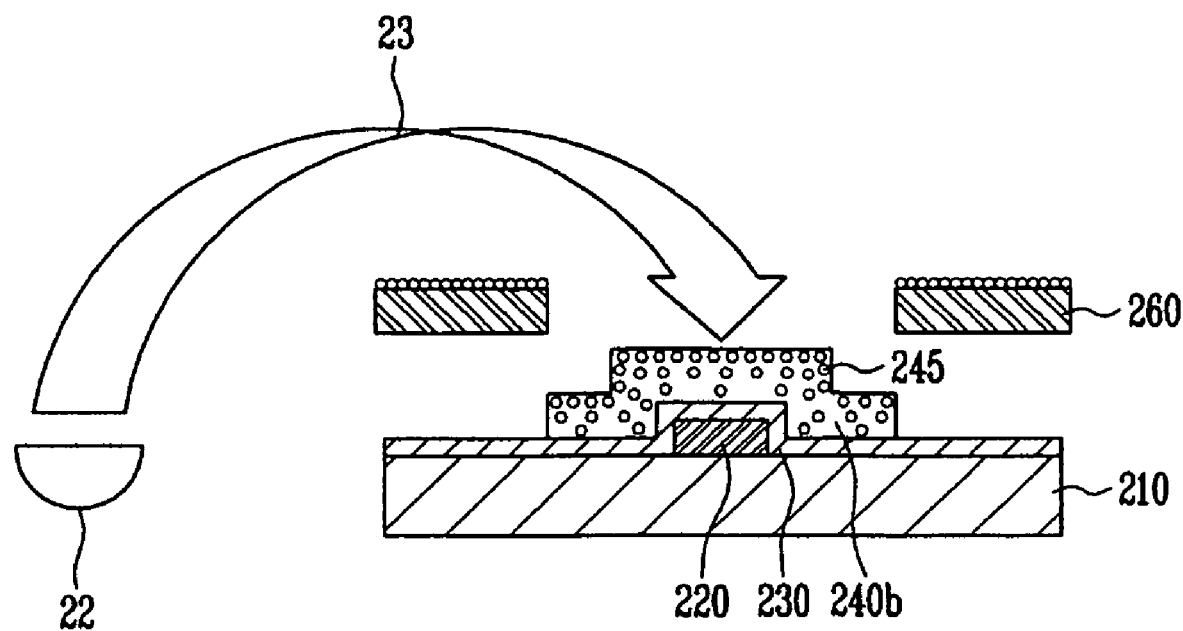
Figure 4E:
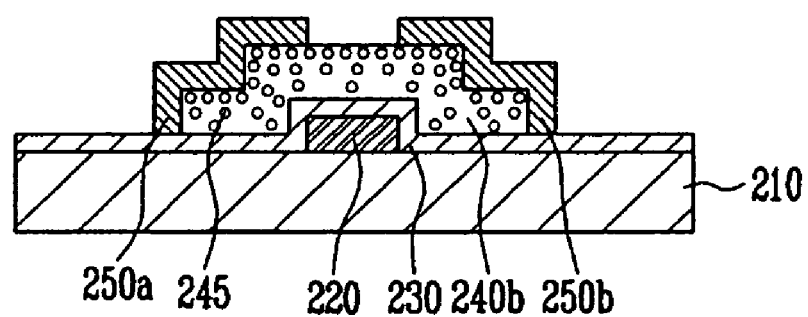

FIG. 2 is a cross-sectional view of a thin film transistor according to an embodiment of the present invention. FIG. 3 is a graph of the impurities distributed inside a semiconductor layer according to one embodiment of the present invention.

With reference to FIGS. 2 and 3, a thin film transistor 200 according to one embodiment of the present invention includes a substrate 210, a gate electrode 220, a gate insulating layer 230, a semiconductor layer 240b, a source electrode 250a, and a drain electrode 250b. The gate electrode 220 is formed on the substrate 210. The gate insulating layer 230 is formed on the substrate 210 over the gate electrode 220. The semiconductor layer 240b is formed on the gate insulating layer 230, and includes a channel region, a source region, and a drain region. The source electrode 250a and drain electrode 250b are patterned and formed on the semiconductor layer 240b. Here, the semiconductor layer 240b is a P-type semiconductor layer obtained by diffusing phosphorus (P) 245 into a zinc oxide semiconductor. The phosphorus (P) 245 is doped in the semiconductor layer 240b at a concentration ranging from about $1\times10^{14}$ to about $1\times10^{18}$ cm$^{-3}$.

The semiconductor layer 240b is a P-type semiconductor. The semiconductor layer 240b is formed by diffusing the phosphorus (P) in an N-type oxide semiconductor, namely, one selected from ZnO, ZnGaO, AnInO, In$_2$O$_3$, ZnInGaO, ZnSnO, and combinations thereof.

For example, in general, oxygen vacancy occurs in a zinc oxide (ZnO) thin film. Phosphorus (P) is substituted at an oxide position of the zinc oxide (ZnO) thin film to form a P-type semiconductor layer 240b. Here, a doping concentration of the phosphorus (P) diffused in the semiconductor layer 240b ranges from about $1\times10^{14}$ to about $1\times10^{18}$ cm$^{-3}$. This doping concentration transforms the N-type oxide semiconductor layer into a P-type semiconductor layer because when the doping concentration of the phosphorus (P) is less than about $1\times10^{14}$ cm$^{-3}$, the resistivity of the semiconductor layer 240b is rapidly increased, thereby deteriorating mobility and on-current characteristics. In contrast, when the doping concentration of the phosphorus (P) is greater than about $1\times10^{18}$ cm$^{-3}$, the $I_{on/off}$ flickering rate can be deteriorated due to rapid increases in leakage current.

Furthermore, upon diffusing impurities, the impurities distributed inside the semiconductor layer 240b have an error function shape, as shown in FIG. 3. Namely, when a surface concentration of the semiconductor layer 240b is fixed with Co, an average diffusion distance of the impurities is proportional to ½ of the product of diffusion coefficient and diffusion time. This is understood through the following Equation 1.

$$\alpha = 2\sqrt{Dt} \quad (1)$$

In Equation 1, a is the diffusion coefficient, D is the diffusion distance, and t is the diffusion time.

As illustrated earlier, the N-type oxide semiconductor layer is transformed into the P-type semiconductor layer by the diffusion process, thereby adjusting the concentration distribution and junction depth of the impurities inside the semiconductor layer 240b.

FIGS. 4A to 4E are cross-sectional views of a thin film transistor at various points in a manufacturing method of a thin film transistor according to an embodiment of the present invention. Referring to FIGS. 4A to 4E, after a gate electrode 220 is formed on a substrate 210, a gate insulating layer 230 is formed on a surface of the substrate 210 including the gate electrode 220. The gate insulating layer 230 may be formed on the entire surface of the substrate 210 including the gate electrode.

On the gate insulating layer 230, an N-type oxide semiconductor, namely, one selected from ZnO, ZnGaO, AnInO, In$_2$O$_3$, ZnInGaO, ZnSnO, and combinations thereof is formed by sputtering, chemical vapor deposition (CVD), or atomic layer deposition (ALD), thereby forming a semiconductor layer 240b.

Next, the substrate 210 on which the semiconductor layer 240b is formed is loaded in a diffusion reaction system 20. When the substrate 210 including the semiconductor layer 240b is loaded in a diffusion reaction system 20, a valve 21 is opened and closed to inject nitrogen (N$_2$) gas in the diffusion reaction system. Accordingly, a nitrogen (N$_2$) gas atmosphere is maintained inside the diffusion reaction system. Further, a mask 260 is arranged above the substrate 210 to prevent impurities from being distributed on the gate insulation layer 230 around the semiconductor layer 240b. Here, the mask 260 has an opening with a size corresponding to the semiconductor layer 240b.

Next, a source boat 22 containing $Zn_3P_2$ powder is heated at a temperature ranging from about 450 to about 500° C. to sublime (23) the $Zn_3P_2$ powder. When the sublimed $Zn_3P_2$ powder is deposited on the semiconductor layer 240b, the diffusion temperature and time are adjusted to diffuse the impurities 245 in the semiconductor layer 240b. Accordingly, the impurities 245 are spread and distributed in the semiconductor layer 240b vertically and horizontally.

Moreover, when the diffusion process is performed using the $Zn_3P_2$ powder, impurities such as arsenic (As) and cadmium (Cd) can be contained in the $Zn_3P_2$ powder. To prevent the arsenic (As) and the cadmium (Cd) from being diffused in the semiconductor layer 240b, $Zn_3P_2$ is refined to high purity to provide the semiconductor layer 240b without arsenic (As) and cadmium (Cd).

Subsequently, conductive metals (such as aluminum (Al), aluminum alloys, silver (Ag), silver alloys, MoW, Molybdenum (Mo), copper (Cu), ITO, and IZO) are deposited and patterned on the semiconductor layer 240b and the gate insulating layer 230, thereby forming a source electrode 250a and a drain electrode 250b.

Figure 5:
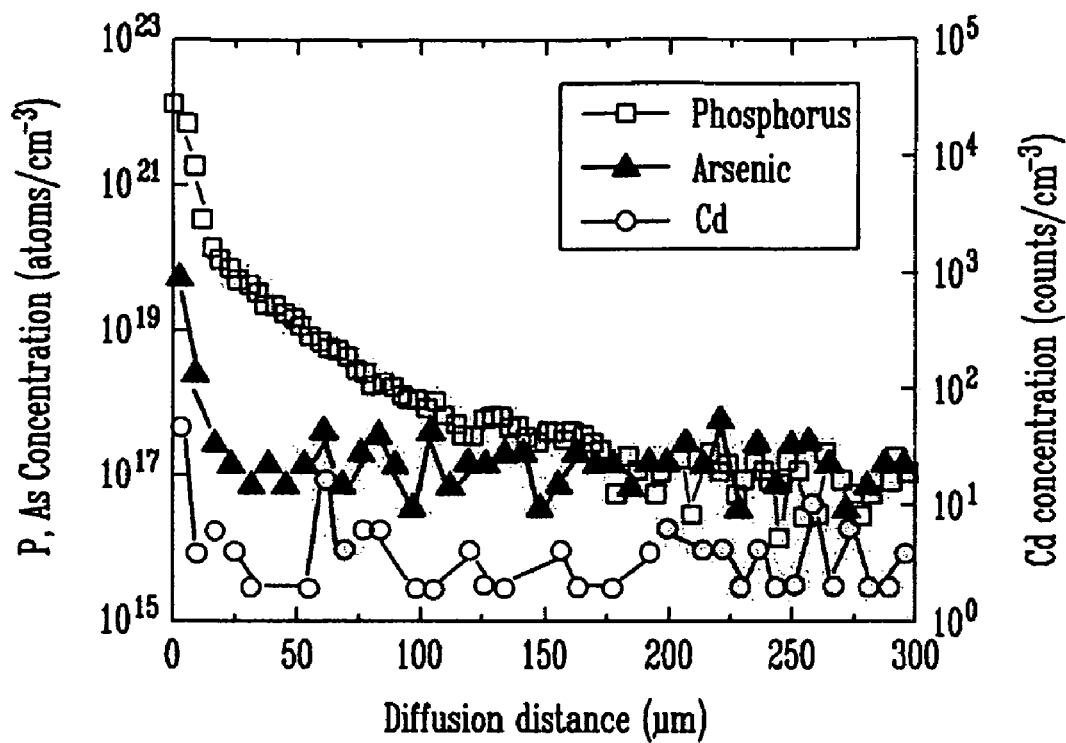
FIG. 5 is a graph of the impurities distributed inside a semiconductor layer according to one embodiment of the present invention.

FIG. 5 is a graph of the impurities distributed inside a semiconductor layer 240b according to an embodiment of the present invention, and graphs the impurities concentration according to diffusion distance of a P-type semiconductor layer formed by diffusion. Referring to FIG. 5, after the zinc oxide (ZnO) semiconductor is loaded in the diffusion reaction system, a source boat 22 containing $Zn_3P_2$ powder is heated at a temperature of about 450° C. for about 30 minutes under a nitrogen atmosphere to form a P-type zinc compound semiconductor layer. FIG. 5 is a SIMS composition distribution of the P-type zinc compound semiconductor layer.

As indicated in the graph of FIG. 5, the x axis represents diffusion distance (μm), and the y axis represents the concentrations (atoms/cm$^3$, counts/cm$^3$) of phosphorus (P), arsenic (As), and cadmium (Cd). The diffusion distance and the diffusion concentration are measured from a diffusion starting surface to a surface direction contacting the substrate. For example, when the diffusion distance is 50 μm, the phosphorus (P), arsenic (As), and cadmium (Cd) have concentrations of $10^{18}$ atoms/cm$^{-3}$, $10^{17}$ atoms/cm$^{-3}$, and $10^{15}$ atoms/cm$^{-3}$, respectively. Using the graph, the impurities distributed in the semiconductor layer can be estimated. It may be estimated from the graph that the impurities distributed in the semiconductor layer measure approximately 0.1 μm, as determined by the concentrations of phosphorus (P), arsenic (As), and cadmium (Cd), which are distributed at a diffusion distance of several hundreds μm.

Figure 6:
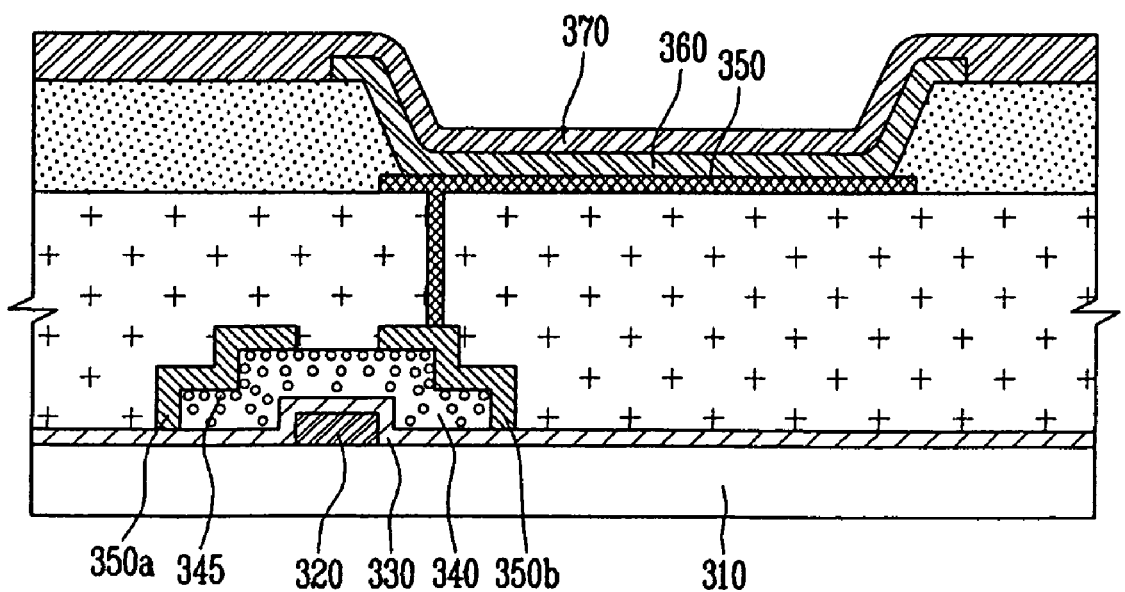
FIG. 6 is a cross-sectional view of an organic light emitting display according to one embodiment of the present invention.

FIG. 6 is a cross-sectional view of an organic light emitting display 300 according to an embodiment of the present invention. Referring to FIG. 6, an organic light emitting display 300 according to an embodiment of the present invention includes a substrate 310, a thin film transistor, and organic light emitting diodes (including components 350, 360 and 270 described in detail below). The thin film transistor includes a semiconductor layer 340, a gate electrode 320, and source/drain electrodes 350a and 350b on the substrate 310. The organic light emitting diodes are electrically coupled to the thin film transistor. Here, the semiconductor layer 340 is composed of a P-type semiconductor layer obtained by diffusing phosphorus (P) 345 into a zinc oxide semiconductor. The phosphorus (P) 345 is doped in the semiconductor layer at a concentration ranging from about $1\times10^{14}$ to about $1\times10^{18}$ cm$^{-3}$.

The thin film transistor formed on the substrate 310 has the same structure as that of the thin film transistor of FIG. 2, and may be manufactured by the same method as that shown in FIGS. 4A to 4E. The thin film transistor includes a gate electrode 320, a gate insulating layer 330, a semiconductor layer 340, a source electrode 350a, and a drain electrode 350b. The gate electrode 320 is formed on the substrate 310. The gate insulating layer 330 is formed on the substrate 310 over the gate electrode 320. The semiconductor layer 340 is formed on the gate insulating layer 330, and includes a channel region, a source region, and a drain region. The source electrode 350a and the drain electrode 350b are patterned and formed on the semiconductor layer 340.

The semiconductor layer 340 is composed of a P-type semiconductor. The semiconductor layer 340 is formed by diffusing the phosphorus (P) 345 into an N-type oxide semiconductor, namely, into a material selected from ZnO, ZnGaO, AnInO, $In_2O_3$, ZnInGaO, ZnSnO, and combinations thereof. In general, oxygen vacancy occurs in a zinc oxide (ZnO) thin film. Phosphorus (P) 345 is substituted at an oxide position of the zinc oxide (ZnO) thin film to form a P-type semiconductor layer 340. Here, the doping concentration of the phosphorus (P) 345 diffused in the semiconductor layer 340 ranges from about $1\times10^{14}$ to about $1\times10^{18}$ cm$^{-3}$. This doping concentration transforms the N-type oxide semiconductor layer to a P-type semiconductor layer because when the doping concentration of the phosphorus (P) 345 is less than about $1\times10^{14}$ cm$^{-3}$, the resistivity of the semiconductor layer 340 is rapidly increased, thereby deteriorating mobility and on-current characteristics. In contrast, when the doping concentration of the phosphorus (P) 345 is greater than about $1\times10^{18}$ cm$^{-3}$, the $I_{on/off}$ flickering rate can be deteriorated due to rapid increases in leakage current.

An organic light emitting diode is formed on the thin film transistor and is electrically coupled to the thin film transistor. The organic light emitting diode includes an anode electrode 350, an emission layer 360, and a cathode electrode 370, which are patterned in a pixel region. The anode electrode 350 is electrically coupled to the drain electrode 350b of the thin film transistor through a via hole. The anode electrode 350 is patterned by photolithography to correspond to the shape of the pixel region defined by a pixel defining layer. The emission layer 360 is formed on the anode electrode 350. The emission layer 360 includes an electron injection layer, an electron transport layer, a hole injection layer, and a hole transport layer. The cathode electrode 370 is formed on the emission layer 360.

In the organic light emitting diode, when a voltage is applied to the anode electrode 350 and the cathode electrode 370, holes injected from the anode electrode 350 are moved to the emission layer 360 through the hole transport layer. Further, electrons from the cathode electrode 370 are injected into the emission layer 360 through the electron transport layer. The holes and the electrons are recombined on the emission layer 360 to produce excitons. The excitons are changed from an excited state to a ground state, and accordingly, phosphor molecules in the emission layer 360 are irradiated to form an image.

By applying the P-type zinc compound semiconductor layer 340 to the organic light emitting display 300, an organic light emitting diode having low operation voltage and excellent emitting efficiency can be provided. Further, the P-type zinc compound semiconductor layer 340 may be combined with an NMOS device to easily form a CMOS device, and to embody an internal drive circuit for a high performance, low power flat panel display.

Figure 7:
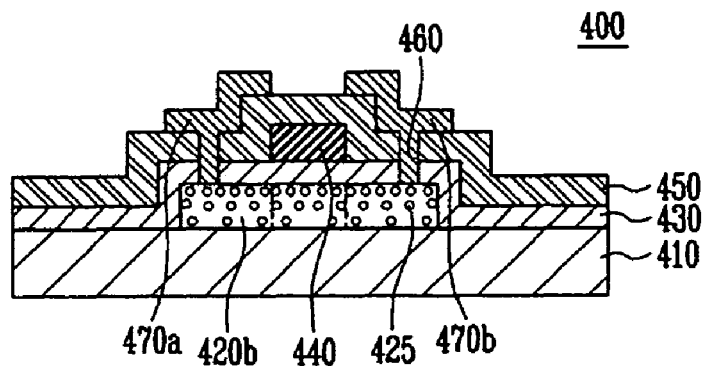
FIG. 7 is a cross-sectional view of a thin film transistor according to another embodiment of the present invention.
Figure 8A:
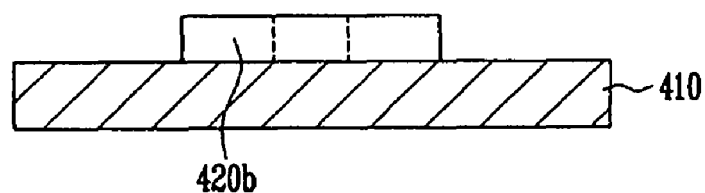
FIG. 8A to FIG. 8D are cross-sectional views of a thin film transistor at various points in a manufacturing method of a thin film transistor according to another embodiment of the present invention.
Figure 8B:
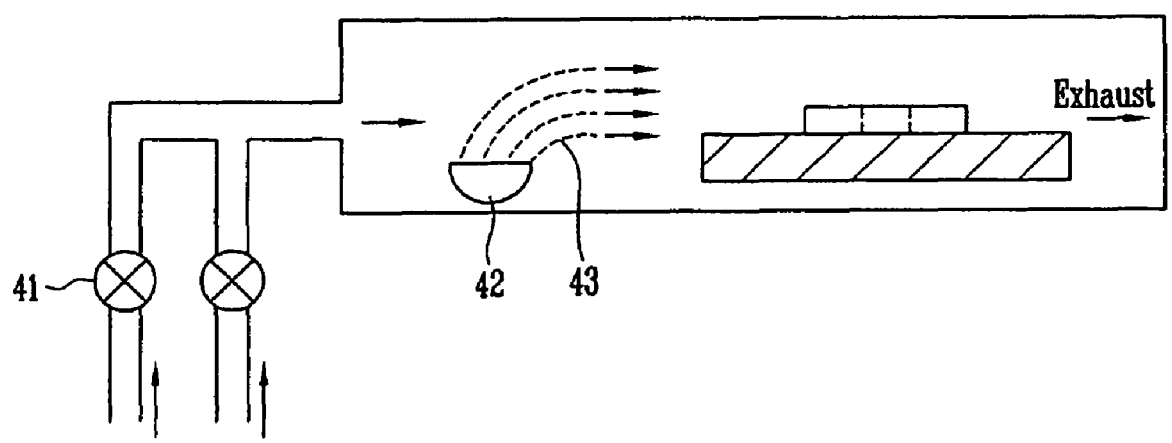
Figure 8C:
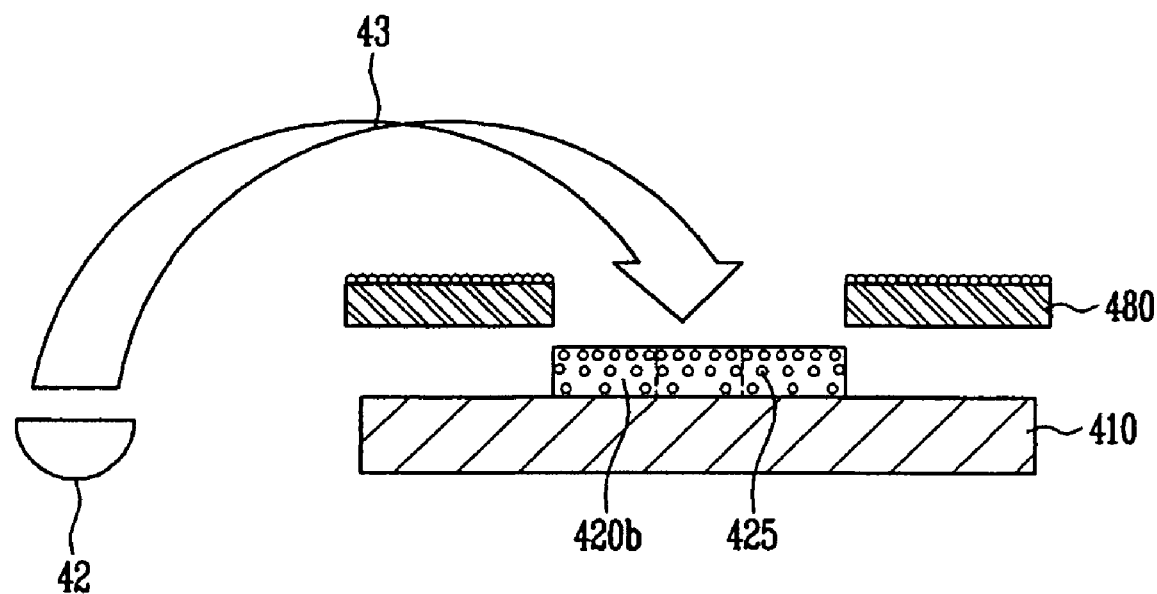
Figure 8D:
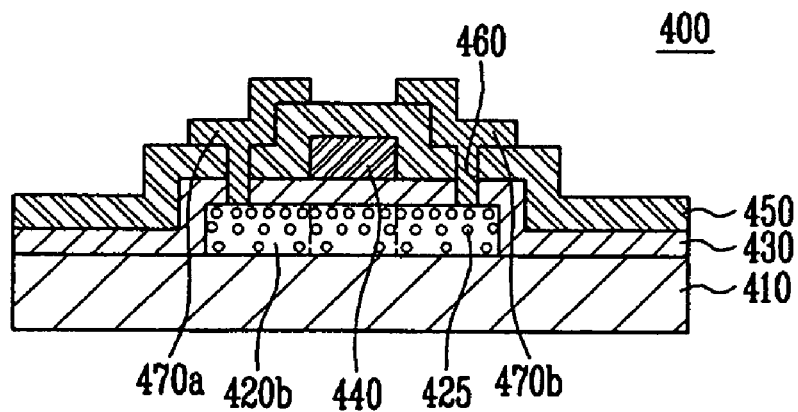

FIG. 7 is a cross-sectional view of a thin film transistor 400 according to another embodiment of the present invention. With reference to FIG. 7, the thin film transistor 400 includes a substrate 410, a semiconductor layer 420b, a gate insulating layer 430, a gate electrode 440, an interlayer insulation layer 450, a source electrode 470a, and a drain electrode 470b. The semiconductor layer 420b is formed on the substrate 410, and includes a channel region, a source region, and a drain region. The gate insulating layer 430 is formed on the semiconductor layer 420b. The gate electrode 440 is formed on the gate insulating layer 430 corresponding to the channel region of the semiconductor layer 420b. The interlayer insulation layer 450 is formed on a surface of the gate insulating layer 430 over the gate electrode 440, and in some embodiments may be formed on the entire surface of the gate insulating layer 430. The source electrode 470a and the drain electrode 470b are coupled to the source region and the drain region of the semiconductor layer 420b through contact holes 460 formed in the gate insulating layer 430 and the interlayer insulation layer 450. Here, the semiconductor layer 420b is composed of a P-type semiconductor layer obtained by diffusing phosphorus (P) 425 into a zinc oxide semiconductor. The phosphorus (P) 425 is doped in the semiconductor layer 420b at a concentration ranging from about $1 \times 10^{14}$ to about $1 \times 10^{18}$ cm$^{-3}$.

The semiconductor layer 420b is composed of a P-type semiconductor. The semiconductor layer 420b is formed by diffusing the phosphorus (P) into an N-type oxide semiconductor, namely, into a material selected from ZnO, ZnGaO, AnInO, $In_2O_3$, ZnInGaO, ZnSnO, and combinations thereof. In general, oxygen vacancy occurs in a zinc oxide (ZnO) thin film. Phosphorus (P) is substituted at an oxide position of the zinc oxide (ZnO) thin film to form a P-type semiconductor layer 420b. Here, a doping concentration of the phosphorus (P) diffused in the semiconductor layer 420b ranges from about $1 \times 10^{14}$ to about $1 \times 10^{18}$ cm$^{-3}$. This doping concentration transforms the N-type oxide semiconductor layer to a P-type semiconductor layer. When the doping concentration of the phosphorus (P) is less than about $1 \times 10^{14}$ cm$^{-3}$, the resistivity of the semiconductor layer 420b is rapidly increased, thereby deteriorating mobility and on-current characteristics. In contrast, when the doping concentration of the phosphorus (P) is greater than about $1 \times 10^{18}$ cm$^{-3}$, the $I_{on/off}$ flickering rate can be deteriorated due to rapid increases in leakage current. Accordingly, the doping concentration of the phosphorus (P) ranges from about $1 \times 10^{14}$ to about $1 \times 10^{18}$ cm$^{-3}$.

The source electrode 470a and drain electrode 470b are patterned and formed on the source/drain regions of the semiconductor layer 420b and the interlayer insulation layer 450. Nonlimiting examples of suitable materials for the source electrode 470a and drain electrode 470b include conductive metal oxides, such as aluminum (Al), aluminum alloys, silver (Ag), silver alloys, MoW, Molybdenum (Mo), copper (Cu), ITO, and IZO.

FIGS. 8A to 8D are cross-sectional views of a thin film transistor at various points in a manufacturing method of a thin film transistor according to an embodiment of the present invention. Referring to FIGS. 8A to 8D, the substrate 410 on which the semiconductor layer 420b is formed is loaded in a diffusion reaction system 40. When the substrate 410 including the semiconductor layer 420b is loaded in the diffusion reaction system 40, a valve 41 is opened and closed to inject nitrogen ($N_2$) gas in the diffusion reaction system. Accordingly, a nitrogen ($N_2$) gas atmosphere is maintained inside the diffusion reaction system. Further, a mask 480 is arranged above the substrate 410 to prevent impurities from being distributed on the gate insulation layer 430 around the semiconductor layer 420b. Here, the mask 480 has an opening with a size corresponding to the semiconductor layer 420b.

Next, a source boat 42 containing $Zn_3P_2$ powder is heated at a temperature ranging from about 450 to about 500° C. to sublime (43) the $Zn_3P_2$ powder. When the sublimed $Zn_3P_2$ powder is deposited on the semiconductor layer 420b, the diffusion temperature and diffusion time are adjusted to diffuse the impurities 425 in the semiconductor layer 420b. Accordingly, the impurities 425 are spread and distributed in the semiconductor layer 420b vertically and horizontally.

Moreover, when the diffusion process is performed using the $Zn_3P_2$ powder, impurities such as arsenic (As) and cadmium (Cd) can be contained in the $Zn_3P_2$ powder. To prevent the arsenic (As) and cadmium (Cd) from being diffused into the semiconductor layer 420b, the $Zn_3P_2$ is refined to high purity to provide a semiconductor layer 420b without arsenic (As) and cadmium (Cd).

A gate insulating layer 430 is formed on a surface of the substrate 410 over the semiconductor layer 420b. In some embodiments, the gate insulating layer 430 may be formed on the entire surface of the substrate 410. A gate electrode 440 is formed on the gate insulating layer 430 corresponding to the channel region of the semiconductor layer 420b. An interlayer insulation layer 450 is formed on the gate insulating layer 430 over the gate electrode 440. Contact holes 460 are formed in the gate insulating layer 430 and the interlayer insulation layer 450 for connecting a source region of the semiconductor layer 420b to the source electrode 470a, and for connecting a drain region of the semiconductor layer 420b to the drain electrode 470b.

Subsequently, conductive metals (such as aluminum (Al), aluminum alloys, silver (Ag), silver alloys, MoW, Molybdenum (Mo), copper (Cu), ITO, and IZO) are deposited and patterned on the interlayer insulation layer 450 and the contact hole 460, thereby forming a source electrode 470a and a drain electrode 470b, which are electrically coupled to the source region and the drain region of the semiconductor layer 420b, respectively.

Figure 9:
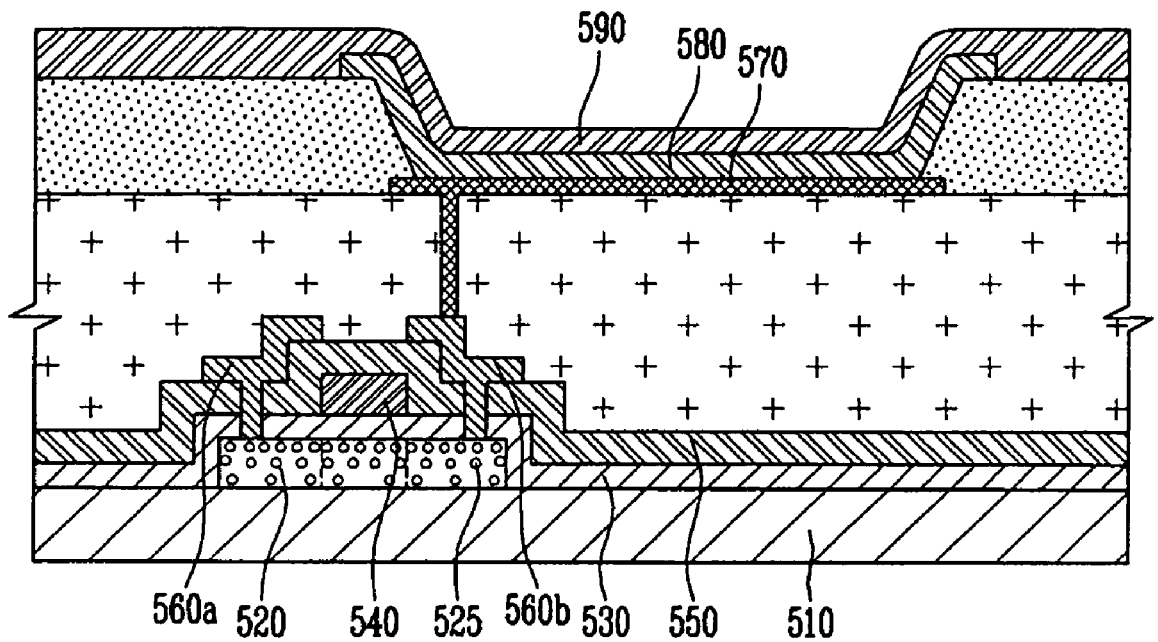
FIG. 9 is a cross-sectional view of an organic light emitting display according to another embodiment of the present invention.

FIG. 9 is a cross-sectional view of an organic light emitting display according to an embodiment of the present invention. Referring to FIG. 9, the organic light emitting display 500 includes a substrate 510, a thin film transistor, and organic light emitting diodes (including components 570, 580, and 590, described in detail below). The thin film transistor includes a semiconductor layer 520, a gate electrode 540, and source/drain electrodes 560a and 560b formed on the substrate 510. The organic light emitting diodes are electrically coupled to the thin film transistor. Here, the semiconductor layer 520 is composed of a P-type semiconductor layer obtained by diffusing phosphorus (P) 525 into a zinc oxide semiconductor. The phosphorus (P) 525 is doped in the semiconductor layer at a concentration ranging from about $1 \times 10^{14}$ to about $1 \times 10^{18}$ cm$^{-3}$.

The thin film transistor formed on the substrate 510 in FIG. 9 has the same structure as that of the thin film transistor of FIG. 7, and may be manufactured by the same method as that in FIGS. 8A to 8D.

The thin film transistor includes a substrate 510, a semiconductor layer 520, a gate insulating layer 530, a gate electrode 540, an interlayer insulation layer 550, a source electrode 560a, and a drain electrode 560b. The semiconductor layer 520 is formed on the substrate 510, and includes a channel region, a source region, and a drain region. The gate insulating layer 530 is formed on the semiconductor layer

520. The gate electrode 540 is formed on the gate insulating layer 530 corresponding to the channel region of the semiconductor layer 520. The interlayer insulation layer 550 is formed on a surface of the gate insulating layer 530 over the gate electrode 540, and in some embodiments, the interlayer insulation layer 550 may be formed on the entire surface of the gate insulating layer 530. The source electrode 560a and the drain electrode 560b are electrically coupled to the source region and the drain region of the semiconductor layer 520, respectively, through contact holes 560, which are formed in the gate insulating layer 530 and the interlayer insulation layer 550.

The semiconductor layer 520 is composed of a P-type semiconductor. The semiconductor layer 520 is formed by diffusing phosphorus (P) 525 into an N-type oxide semiconductor, namely, into a material selected from ZnO, ZnGaO, AnInO, $In_2O_3$, ZnInGaO, ZnSnO, and combinations thereof. In general, oxygen vacancy occurs in a zinc oxide (ZnO) thin film. Phosphorus (P) 525 is substituted at an oxide position of the zinc oxide (ZnO) thin film to form a P-type semiconductor layer 520. Here, the doping concentration of the phosphorus (P) 525 diffused in the semiconductor layer 520 ranges from about $1\times10^{14}$ to about $1\times10^{18}$ cm$^{-3}$. This doping concentration transforms the N-type oxide semiconductor layer to a P-type semiconductor layer. When the doping concentration of the phosphorus (P) 525 is less than about $1\times10^{14}$ cm$^{-3}$, the resistivity of the semiconductor layer 520 is rapidly increased, thereby deteriorating mobility and on-current characteristics. In contrast, when the doping concentration of the phosphorus (P) 525 is greater than about $1\times10^{18}$ cm$^{-3}$, the $I_{on/off}$ flickering rate can be deteriorated due to rapid increases in leakage current. Accordingly, the doping concentration of the phosphorus (P) 525 in the semiconductor layer 520 ranges from about $1\times10^{14}$ to $1\times10^{18}$ cm$^{-3}$.

The source electrode 560a and the drain electrode 560b are patterned and formed on the source/drain regions of the semiconductor layer 520 and the interlayer insulation layer 550. Nonlimiting examples of suitable materials for the source electrode 560a and the drain electrode 560b include conductive metal oxides, such as aluminum (Al), aluminum alloys, silver (Ag), silver alloys, MoW, Molybdenum (Mo), copper (Cu), ITO, and IZO.

An organic light emitting diode is formed on the thin film transistor and is electrically coupled to the thin film transistor. The organic light emitting diode includes an anode electrode 570, an emission layer 580, and a cathode electrode 590, which are patterned in a pixel region. The anode electrode 570 is electrically coupled to the drain electrode 560b of the thin film transistor through a via hole. The anode electrode 570 is patterned by photolithography to correspond to the shape of the pixel region defined by a pixel defining layer. The emission layer 580 is formed on the anode electrode 570. The emission layer 580 includes an electron injection layer, an electron transport layer, a hole injection layer, and an electron transport layer. The cathode electrode 590 is formed on the emission layer 580.

In the organic light emitting diode, when a voltage is applied to the anode electrode 570 and the cathode electrode 590, holes injected from the anode electrode 570 are moved to the emission layer 580 through the hole transport layer. Further, electrons from the cathode electrode 590 are injected into the emission layer 580 through the electron transport layer. The holes and the electrons are recombined on the emission layer 580 to produce excitons. The excitons are changed from an excited state to a ground state, and accordingly, phosphor molecules in the emission layer 580 are irradiated to form an image.

By applying the P-type zinc compound semiconductor layer 520 to the organic light emitting display 500, an organic light emitting diode having low operation voltage and excellent emitting efficiency can be provided. Further, the P-type zinc compound semiconductor layer 520 may be combined with an NMOS device to easily form a CMOS device, and to embody an internal drive circuit for a high performance, low power flat panel display.

In embodiments of the present invention, a phosphorus (P) impurity is diffused into an N-type oxide semiconductor layer to form a P-type semiconductor layer, thereby forming an organic light emitting display using a P-type thin film transistor.

Although the present invention has been illustrated and described with respect to certain exemplary embodiments, those or ordinary skill in the art will recognize that various changes and modifications may be made to the described embodiments without departing from the principle, spirit and scope of the present invention, as defined in the attached claims and their equivalents. For example, while embodiments of the invention have been described to include thin film transistors having top gate (coplanar) structures and bottom gate (inverted-stacked) structures, those skilled in the art would appreciate that N-type oxide semiconductors could also be formed in stacked structures.

What is claimed is:

1. A thin film transistor, comprising:
    a substrate;
    a semiconductor layer on the substrate, the semiconductor layer comprising a P-type semiconductor layer comprising an N-type zinc oxide semiconductor and phosphorus diffused in the zinc oxide semiconductor, wherein the phosphorus is diffused in the N-type zinc oxide semiconductor to a concentration ranging from about $1\times10^{14}$ to about $1\times10^{18}$ cm$^-$3 to convert the N-type zinc oxide semiconductor to a P-type semiconductor;
    a gate electrode on the substrate; and
    source/drain electrodes on the substrate.

2. The thin film transistor as claimed in claim 1, wherein the zinc oxide semiconductor is selected from the group consisting of ZnO, ZnGaO, AnInO, $In_2O_3$, ZnInGaO, ZnSnO, and combinations thereof.

3. A method of manufacturing a thin film transistor, comprising:
    patterning a gate electrode on a substrate;
    forming a gate insulating layer on the gate electrode;
    forming a semiconductor layer on the gate insulating layer, the semiconductor layer comprising N-type zinc oxide semiconductor;
    diffusing a phosphorus compound in the semiconductor layer to convert the N-type zinc oxide semiconductor to a P-type semiconductor to thereby form a P-type semiconductor layer; and
    forming source/drain electrodes on the P-type semiconductor layer.

4. The method as claimed in claim 3, wherein the zinc oxide semiconductor is selected from the group consisting of ZnO, ZnGaO, AnInO, $In_2O_3$, ZnInGaO, ZnSnO, and combinations thereof.

5. The method as claimed in claim 3, wherein the phosphorus compound is diffused in the semiconductor layer to a phosphorus concentration ranging from about $1\times10^{14}$ to about $1\times10^{18}$ cm$^{-3}$.

6. The method as claimed in claim 3, wherein the phosphorus compound is $Zn_3P_2$.

7. The method as claimed in claim 3, wherein the phosphorus compound is a powder.

8. The method as claimed in claim 3, wherein diffusing the phosphorus compound in the semiconductor layer comprises arranging a mask over the semiconductor layer, the mask having an opening in a region corresponding to the semiconductor layer.

9. A method of manufacturing a thin film transistor, comprising:
- forming a semiconductor layer comprising source/drain regions and a channel region on a substrate, the semiconductor layer comprising a zinc oxide semiconductor;
- diffusing a phosphorus compound in the semiconductor layer to form a P-type semiconductor layer;
- forming a gate insulating layer on the semiconductor layer;
- forming a gate electrode on the gate insulating layer in a region corresponding to the channel region of the semiconductor layer;
- forming an interlayer insulation layer on the gate electrode; and
- electrically coupling source/drain electrodes to the semiconductor layer through contact holes in the gate insulating layer and the interlayer insulation layer.

10. The method as claimed in claim 9, wherein the phosphorus compound is diffused in the semiconductor layer to a phosphorus concentration ranging from about $1 \times 10^{14}$ to about $1 \times 10^{18}$ cm$^{-3}$.

11. The method as claimed in claim 9, wherein the phosphorus compound is $Zn_3P_2$.

12. The method as claimed in claim 9, wherein the phosphorus compound is a powder.

13. The method as claimed in claim 9, wherein the zinc oxide semiconductor is selected from the group consisting of ZnO, ZnGaO, AnInO, In$_2$O$_3$, ZnInGaO, ZnSnO, and combinations thereof.

14. The method as claimed in claim 9, wherein diffusing the phosphorus compound in the semiconductor layer comprises arranging a mask over the semiconductor layer, the mask having an opening in a region corresponding to the semiconductor layer.

15. An organic light emitting display, comprising:
- a thin film transistor comprising:
    - a substrate,
    - a semiconductor layer comprising a P-type semiconductor layer comprising an N-type zinc oxide semiconductor and phosphorus diffused in the N-type zinc oxide semiconductor, wherein the phosphorus is diffused in the N-type zinc oxide semiconductor to a concentration ranging from about $1 \times 10^{14}$ to about $1 \times 10^{18}$ cm$^{-3}$ to convert the N-type zinc oxide semiconductor to a P-type semiconductor,
    - a gate electrode, and
    - source/drain electrodes on the substrate; and
- an organic light emitting diode electrically coupled to the thin film transistor.

16. The organic light emitting display as claimed in claim 15, wherein the zinc oxide semiconductor is selected from the group consisting of ZnO, ZnGaO, AnInO, In$_2$O$_3$, ZnInGaO, ZnSnO and combinations thereof.

* * * * *

UNITED STATES PATENT AND TRADEMARK OFFICE
CERTIFICATE OF CORRECTION

PATENT NO. : 7,915,101 B2
APPLICATION NO. : 12/118345
DATED : March 29, 2011
INVENTOR(S) : Jae-Kyeong Jeong et al.

It is certified that error appears in the above-identified patent and that said Letters Patent is hereby corrected as shown below:

In the Claims

Column 10, Claim 1, line 35   Delete "$1 \times 10^{18}$ cm~3"
Insert -- $1 \times 10^{18}$ cm$^{-3}$ --

Signed and Sealed this
Twenty-ninth Day of May, 2012

David J. Kappos
*Director of the United States Patent and Trademark Office*